(12) United States Patent
Amishiro et al.

(10) Patent No.: US 6,835,647 B2
(45) Date of Patent: Dec. 28, 2004

(54) SEMICONDUCTOR DEVICE INCLUDING A PLURALITY OF INTERCONNECTION LAYERS, MANUFACTURING METHOD THEREOF AND METHOD OF DESIGNING SEMICONDUCTOR CIRCUIT USED IN THE MANUFACTURING METHOD

(75) Inventors: Hiroyuki Amishiro, Hyogo (JP); Motoshige Igarashi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/382,902

(22) Filed: Mar. 7, 2003

(65) Prior Publication Data

US 2003/0146516 A1 Aug. 7, 2003

Related U.S. Application Data

(62) Division of application No. 09/907,675, filed on Jul. 19, 2001, now Pat. No. 6,541,862, which is a division of application No. 09/353,379, filed on Jul. 15, 1999, now Pat. No. 6,288,447.

(30) Foreign Application Priority Data

Jan. 22, 1999 (JP) ........................................ 11-014070 P

(51) Int. Cl.$^7$ ......................................... H01L 21/4763
(52) U.S. Cl. ........................ 438/622; 438/623; 438/627
(58) Field of Search ................................. 438/627, 643, 438/653, 618, 666, 638, 927, 118, 622, 623, 624; 257/751, 758, 773, 775

(56) References Cited

U.S. PATENT DOCUMENTS

| | | | |
|---|---|---|---|
| 4,753,851 A | | 6/1988 | Roberts et al. |
| 4,941,031 A | | 7/1990 | Kumagai et al. |
| 4,996,584 A | * | 2/1991 | Young et al. ............... 257/762 |
| 5,264,390 A | | 11/1993 | Nagase et al. |

(List continued on next page.)

FOREIGN PATENT DOCUMENTS

| | | |
|---|---|---|
| JP | 3-62564 A | 3/1991 |
| JP | 7-169842 | 7/1995 |
| JP | 9-181184 | 7/1997 |

OTHER PUBLICATIONS

"The Best Combination of Aluminum and Copper Interconnects for a High Performance 0.18$\mu$m CMOS Logic Device", M. Igarashi et al., IEDM Technical Digest, 1998, pp. 829–832.

*Primary Examiner*—Long Pham
*Assistant Examiner*—Thao X. Le
(74) *Attorney, Agent, or Firm*—McDermott Will & Emery LLP

(57) ABSTRACT

A semiconductor device including an interconnection structure having superior electrical characteristics and allowing higher speed of operation and lower power consumption even when miniaturized, manufacturing method thereof and a method of designing a semiconductor circuit used in the manufacturing method are provided. In the semiconductor device, a conductive region is formed on a main surface of a semiconductor substrate. A first interconnection layer is electrically connected to the conductive region, has a relatively short line length, and contains a material having relatively high electrical resistance. A first insulator is formed to surround the first interconnection layer and has a relatively low dielectric constant. A second interconnection layer is formed on the main surface of the semiconductor substrate, contains a material having low electrical resistance than the material contained in the first interconnection layer, and has longer line length than the first interconnection layer. A second insulator is formed to surround the second interconnection layer and has a dielectric constant higher than the first insulator.

5 Claims, 16 Drawing Sheets

U.S. PATENT DOCUMENTS

| | | | |
|---|---|---|---|
| 5,318,916 A | * | 6/1994 | Enquist et al. ............... 438/320 |
| 5,510,653 A | * | 4/1996 | Fujiki et al. ................. 257/759 |
| 5,621,247 A | * | 4/1997 | Hirao et al. ................. 257/763 |
| 5,631,478 A | * | 5/1997 | Okumura ..................... 257/211 |
| 5,804,879 A | * | 9/1998 | Ogawa et al. ............... 257/765 |
| 6,060,784 A | * | 5/2000 | Oda ........................... 257/758 |
| 6,162,583 A | | 12/2000 | Yang et al. |
| 6,184,121 B1 | * | 2/2001 | Buchwalter et al. ........ 438/622 |
| 6,184,143 B1 | * | 2/2001 | Ohashi et al. ............... 438/697 |
| 6,191,031 B1 | | 2/2001 | Taguchi et al. |
| 6,242,336 B1 | * | 6/2001 | Ueda et al. .................. 438/619 |
| 6,261,883 B1 | * | 7/2001 | Koubuchi et al. .......... 428/197 |
| 6,333,556 B1 | * | 12/2001 | Juengling et al. ........... 257/758 |
| 6,335,569 B1 | | 1/2002 | Joshi |
| 6,348,414 B1 | | 2/2002 | Yun et al. |
| 6,399,496 B1 | | 6/2002 | Edelstein et al. |
| 6,627,539 B1 | * | 9/2003 | Zhao et al. .................. 438/638 |

* cited by examiner ( Al INTERCONNECTION
  • LINE WIDTH=0.3 μm
  • LINE SPACE=0.3 μm
  • LINE FILM THICKNESS=0.53 μm
  • SPECIFIC DIELECTRIC
    CONSTANT OF INTERLAYER
    INSULATING FILM=3.5

Cu INTERCONNECTION
  • LINE WIDTH=0.3 μm
  • LINE SPACE=0.3 μm
  • LINE FILM THICKNESS=0.53 μm
  • SPECIFIC DIELECTRIC
    CONSTANT OF INTERLAYER
    INSULATING FILM=3.5
  • FILM THICKNESS OF $Si_3N_4$ FILM =50nm ($C_{tot}=2C_c+C_{top}+C_{bot}$)

- LINE WIDTH W=0.3 μm
- LINE SPACE S=0.3 μm
- SPECIFIC DIELECTRIC CONSTANT OF INTERLAYER INSULATING FIL k=3.5

(Ctot=2Cc+Ctop+Cbot)

SEMICONDUCTOR DEVICE INCLUDING A PLURALITY OF INTERCONNECTION LAYERS, MANUFACTURING METHOD THEREOF AND METHOD OF DESIGNING SEMICONDUCTOR CIRCUIT USED IN THE MANUFACTURING METHOD

This application is a divisional of application Ser. No. 09/907,675 filed Jul. 19, 2001 now U.S. Pat. No. 6,541,862, which is a divisional of application Ser. No. 09/353,379, filed Jul. 15, 1999 now U.S. Pat. No. 6,288,447.

BACKGROUND OF THE INVENTION

1. Field of the Invention

The present invention relates to a CMOS logic circuit element, a semiconductor device, manufacturing method thereof and to a method of designing a semiconductor circuit used in the manufacturing method. More specifically, the present invention relates to a CMOS logic circuit device, a semiconductor device, manufacturing method thereof and a method of designing a semiconductor circuit used in the manufacturing method enabling higher speed of operation and reduced power consumption and preventing degradation of electrical characteristics, even when the devices are miniaturized.

2. Description of the Background Art

Higher degree of miniaturization, higher speed of operation and lower power consumption have been increasingly desired in semiconductor devices such as represented by CMOS logic circuit devices and DRAMs (Dynamic Random Access Memory). To meet such demands, developments have been made in improving transistor performance, reduction in parasitic capacitance of interconnection layers and reduction of line resistance.

FIG. 19 is a schematic cross section representing a multi-layered interconnection structure of a semiconductor device related to the present invention. Referring to FIG. 19, in the semiconductor device, on a first interlayer insulating film 146a, a first interconnection 145a of aluminum is formed. On the first interconnection 145a, second interconnections 145b to 145d of aluminum are formed with a second interlayer insulating film 146b interposed. On second interconnections 145b to 145d, a third interconnection 145e is formed with a second interlayer insulating film 146b. On the third interconnection 145e, a third interlayer insulating film 146c is formed. Here, second interconnections 145b to 145d are formed to extend in a direction approximately orthogonal to the direction of extension of the first and third interconnections 145a and 145e.

Referring to FIG. 19, as the semiconductor devices have been miniaturized, a space S between interconnections becomes smaller. As the space S between interconnections becomes smaller, total parasitic capacitance Ctot (hereinafter referred to as total capacitance) of interconnection 145c has been increasing. Here, the total capacitance Ctot is represented as the total sum of parasitic capacitance Cc formed between interconnections 145b and 145d adjacent in horizontal direction, parasitic capacitance Ctop formed between interconnections 145e and 145c, and parasitic capacitance Cbot formed between interconnections 145a and 145c. When the space S between interconnections is made small, the ratio of parasitic capacitance Cc with respect to total capacitance Ctot attains as high as about 80%.

Therefore, conventionally, in order to reduce the parasitic capacitance Cc between interconnections in the horizontal direction, a proposal has been made to place an insulator having relatively low dielectric constant such as a silicon oxide film to which fluorine added (SiOF) between adjacent interconnections, so as to reduce parasitic capacitance Cc in the horizontal direction.

The insulator having low dielectric constant such as SiOF, however, involves larger amount of leakage current as compared with the conventionally used silicon oxide film and, further, it suffers from the problem of high reactivity with the material such as aluminum of interconnections 145a to 145e. Accordingly, a multi-layered interconnection structure of a semiconductor device such as shown in FIG. 20 has been proposed.

FIG. 20 is a schematic cross section showing another example of the multi-layered interconnection structure of a semiconductor device related to the present invention. Referring to FIG. 20, the semiconductor device basically has the similar structure as the semiconductor device of FIG. 19. In the semiconductor device shown in FIG. 20, however, surfaces of second interconnections 145b to 145d are covered by portions 157a to 157c of the interlayer insulating film, which are parts of the conventional interlayer insulating film 146b of silicon oxide. Insulators 156a to 156d having low dielectric constant such as SiOF, having lower dielectric constant than silicon oxide film constituting the interlayer insulating film 146b, are arranged between interconnections 145b to 145d. On second interlayer insulating film 146b and insulators 156a to 156d of low dielectric constant, an interlayer insulating film 146d of silicon oxide is formed.

In this manner, as insulators 156a to 156d having low dielectric constant are arranged between interconnections 145b to 145d, parasitic capacitance Cc in the horizontal direction of interconnection 145c can be effectively reduced. Further, as portions 157a to 157c of interlayer insulating film formed of silicon oxide are formed between interconnections 145b to 145d and insulators 156a to 156d of low dielectric constant, direct contact between interconnections 145b to 145d with insulators 156a to 156d of low dielectric constant can be prevented. Therefore, reaction between interconnections 145b to 145d and insulators 156a to 156d having low dielectric constant can be prevented. Accordingly, degradation of electrical characteristics of the semiconductor device caused by fluctuation of electrical characteristics of interconnections 145b to 145d can be prevented.

While the semiconductor devices has been miniaturized with the parasitic capacitance of interconnections reduced, cross sectional area of the interconnection itself has been reduced, as the semiconductor devices has been miniaturized. Smaller cross sectional area of the interconnection leads to increased line resistance, which causes degradation of electrical characteristic such as slower speed of operation of the semiconductor device, which is a significant problem. For this reason, use of copper having lower resistance as the material of interconnection in place of conventionally used aluminum, has been studied. When copper is used as the material of the interconnection, line resistance can be decreased even when the interconnection has the same cross sectional area as the aluminum interconnection. Accordingly, higher speed of operation and lower power consumption of the semiconductor device can be attained.

In Damascene process used generally in forming copper interconnection, a silicon nitride film or the like is used as an etching stopper in the process. The silicon nitride film remains in the interlayer insulating film even after the copper interconnection is completed. Here, the silicon nitride film has higher dielectric constant than the silicon oxide film which has been conventionally used as the interlayer insulating film. Therefore, in view of parasitic capacitance of interconnections, sometimes the total capacitance Ctot attains higher than in the conventional example, when copper interconnection is formed. The inventors have found that, as a result, it is difficult to obtain a semiconductor device having superior electrical characteristics and allowing higher speed of operation and lower power consumption simply by replacing the conventional aluminum interconnection with copper interconnection.

When the interconnection is formed using copper, a barrier metal layer is formed on the surface of the interconnection, in order to prevent diffusion of copper to the interlayer insulating film. Here, the barrier metal layer must have a minimum film thickness to maintain its function. Generally, a material for the barrier metal layer has higher electrical resistance than copper. As the semiconductor devices have been miniaturized, the ratio of barrier metal layer with respect to the cross sectional area of the interconnection increases, and therefore influence of the barrier metal layer on the line resistance comes to be non-negligible. Line resistance may be out of the designed range because of variation in film thickness of the barrier metal layer. The inventors have also found that this leads to the problem of degraded electrical characteristics of the semiconductor device.

SUMMARY OF THE INVENTION

One object of the present invention is to provide a semiconductor device including an interconnection structure having superior electrical characteristics allowing higher speed of operation and lower power consumption even when the device is miniaturized.

Another object of the present invention is to provide a CMOS logic circuit device including an interconnection structure having superior electrical characteristics allowing higher speed of operation and lower power consumption even when miniaturized.

A further object of the present invention is to provide a method of manufacturing a semiconductor device including an interconnection structure having superior electrical characteristics allowing higher speed of operation and lower power consumption even when miniaturized.

A still further object of the present invention is to provide a method of designing a semiconductor circuit used in the method of manufacturing the semiconductor device including an interconnection structure having superior electrical characteristics allowing higher speed of operation and lower power consumption even when miniaturized.

The semiconductor device according to the aforementioned one aspect of the present invention includes a semiconductor substrate, a conductive region, a first interconnection layer, a first insulator, a second interconnection layer and a second insulator. The semiconductor substrate has a main surface. The conductive region is formed on the main surface of the semiconductor substrate. First interconnection layer is electrically connected to the conductive region, has a relatively short line length, and contains a material having relatively high electrical resistance. The first insulator is formed to surround the first interconnection layer and has a relatively low dielectric constant. The second interconnection layer is formed on the main surface of the semiconductor substrate, contains a material having lower electrical resistance than the material contained in the first interconnection layer, and has longer line length than the first interconnection layer. The second insulator is formed to surround the second interconnection layer and has higher dielectric constant than the first insulator.

Here, in the first interconnection layer having relatively short line length such as a short interconnection within a circuit block, for example, it is necessary to reduce the distance between interconnections as small as possible, as the degree of integration of the circuit elements is increased. When the distance between interconnections is reduced, reduction in parasitic resistance between interconnections is particularly effective in improving the speed of operation of the semiconductor device.

In the semiconductor device in accordance with one aspect of the present invention, as a first insulator having relatively low dielectric constant is formed to surround a first interconnection layer having relatively short line length, parasitic resistance between interconnections of the first interconnection layer can be made smaller than the parasitic resistance between interconnections of the second interconnection layer. As a result, the speed of operation of the semiconductor device can effectively be improved. Therefore, a semiconductor device having such an interconnection structure that ensures superior electrical characteristics can be obtained.

Further, the second interconnection layer which has longer line length than the first interconnection layer contains material having low electrical resistance than the material contained in the first interconnection layer, and therefore the line resistance of the second interconnection layer can be made lower than that of the first interconnection layer. Here, in the second interconnection layer which corresponds to the long line such as interconnections between circuit blocks, reduction in line resistance is more effective in improving the speed of operation of the semiconductor device. Therefore, the semiconductor device in accordance with one aspect of the present invention enables higher speed of operation.

Further, by reducing line resistance, power consumption of the semiconductor device can be reduced. As a result, a semiconductor device having such an interconnection structure that ensures superior electrical characteristics can be obtained.

In the semiconductor device in accordance with the above described one aspect, the second and the first interconnection layers may be formed on different layers on the main surface of the semiconductor substrate.

Here, as the first and second interconnection layers of mutually different line lengths are formed in different layers, the interconnection structure in the semiconductor device can be simplified as compared when the first and second interconnection layers of different line lengths are formed in one layer.

When the first and second interconnection layers are formed in different layers in this manner, an insulator in one layer can be formed by one material, even when the first and second insulators are to be formed by different materials. Therefore, it is possible to form the first and second insulators through the same process steps as in the conventional process for forming insulators. Therefore, the steps of manufacturing the semiconductor device are not complicated. As a result, the number of steps for manufacturing the semiconductor device is not increased, and therefore increase in cost in manufacturing the semiconductor device can be prevented.

In the semiconductor device in accordance with the above described one aspect, the second interconnection layer may be formed in a layer upper than the layer in which the first interconnection layer is formed.

In this case, the first interconnection layer having relatively short line length is formed at a region closer to the elements on the semiconductor substrate. The second interconnection layer corresponding to the long distance interconnection for connecting circuit blocks is formed upper than the first interconnection layer, and therefore the interconnection path of the second interconnection layer can be miniaturized without much adverse influence of the arrangement of the first interconnection layer. Therefore, total line length can be reduced than when the first interconnection layer is formed upper than the second interconnection layer. As a result, higher speed of operation and lower power consumption of the semiconductor device can be attained.

In the semiconductor device in accordance with the above described one aspect, the second insulator may be positioned above and below the second interconnection layer.

In the semiconductor device in accordance with the above described one aspect, the first interconnection layer may include aluminum, and the second interconnection layer may include copper.

Here, copper has lower electrical resistance than the conventional interconnection material of aluminum, and has longer electro migration life. Further, the material cost is lower and is superior as an interconnection material. As the second interconnection layer contains copper, higher speed of operation and lower power consumption of the semiconductor device can be ensured.

Further, as the first interconnection layer contains aluminum, the manufacturing apparatuses and processes for forming the conventional aluminum interconnection can be used directly, when the first interconnection layer is formed. Therefore, the semiconductor device in accordance with the present invention can be manufactured easily.

In the semiconductor device in accordance with the above described one aspect, the second insulator may contain a silicon nitride film.

The silicon nitride film may be used as an etching stopper in the Damascene process for forming the second interconnection layer containing copper. Therefore, the second interconnection layer containing copper can be readily formed.

In the semiconductor device in accordance with the above described one aspect, the first insulator may include a silicon oxide film.

In the semiconductor device in accordance with the above described one aspect, cross sectional area of the second interconnection layer may be the same or larger than the cross sectional area of the first interconnection layer.

Here, when the second interconnection layer corresponding to the long distance interconnection such as the line for connecting circuit blocks is adapted to have larger cross sectional area than the first interconnection layer, line resistance of the second interconnection layer can further be reduced. Therefore, higher speed of operation and lower power consumption of the semiconductor device can be attained.

In the semiconductor device in accordance with the above described one aspect, the first interconnection layer may include third and fourth interconnection layers, and the second interconnection layer may include fifth and sixth interconnection layers. The distance between the fifth and sixth interconnection layers may be the same or longer than the distance between the third and fourth interconnection layers.

Here, in the second interconnection layer corresponding to the long distance interconnection such as the line for connecting circuit blocks, the distance between interconnections may be made larger than in the first interconnection layer, and therefore parasitic resistance between lines in the second interconnection layer can surely be reduced. As a result, higher speed of operation of the semiconductor device can be attained.

In the semiconductor device in accordance with the above described first aspect, the second interconnection layer may have one side surface and the other side surface positioned opposite to the one side surface, and barrier metal layers may be formed on one and the other side surfaces. Total film thickness BM of the barrier metal layer may be selected to satisfy the relation of $BMmin/W \leq BM/W \leq 1-(K/(K-1)) \times \Delta W/W$, where W represents set line width of the second interconnection layer in a direction approximately vertical to the one side surface, BM represents total film thickness of the barrier metal layer formed on the one and the other side surfaces, BMmin represents minimum necessary film thickness of the barrier metal layer and K represents tolerable rate of increase in resistance of the second interconnection layer when the set line width W is decreased by $\Delta W$.

Here, line resistance R of a portion having the length 1 of a conductive line of uniform property with uniform cross sectional area S is given by the following equation (1), where $\rho$ represents specific resistance.

When the thickness of the second interconnection layer is represented by T, resistance per unit length of the second interconnection layer is given by the following equation (2).

The resistance per unit length when the set line width W of the second interconnection layer is decreased by $\Delta W$ is represented by the following equation (3).

As the tolerable rate of increase of the resistance of the second interconnection layer when the set line width W is decreased by ΔW is given by K, the second interconnection layer must satisfy the relation represented by the expression (4). The expression can be transformed to expression (5).

As the minimum necessary film thickness of the barrier metal layer is BMmin, the total film thickness BM of the barrier metal layer must also satisfy the relation represented by the expression (6).

As a result, if the total film thickness BM of the barrier metal layer is determined to satisfy the relation of expression (7), it becomes possible. for the barrier metal layer to exhibit its function and for the rate of increase in resistance of the second interconnection layer to be not higher than the tolerable ratio K.

$$R = \frac{L}{S} \times \rho \qquad (1)$$

$$\frac{\rho}{(W - BM) \times T} \qquad (2)$$

$$\frac{\rho}{(W - \Delta W - BM) \times T} \qquad (3)$$

$$\frac{\rho}{(W - \Delta W - BM) \times T} \leq K \times \frac{\rho}{(W - BM) \times T} \qquad (4)$$

$$\frac{BM}{W} \leq 1 - \frac{K}{K-1} \times \frac{\Delta W}{W} \qquad (5)$$

$$\frac{BM\ \min}{W} \leq \frac{BM}{W} \qquad (6)$$

$$\frac{BM\ \min}{W} \leq \frac{BM}{W} \leq 1 - \frac{K}{K-1} \times \frac{\Delta W}{W} \qquad (7)$$

In the semiconductor device in accordance with the above described one aspect, the second interconnection layer has a bottom surface on which a bottom barrier metal layer is formed. Film thickness BMT of the bottom barrier metal layer may be selected to satisfy the relation of BMmin≦BMT/T≦1−(KT/(KT−1))×ΔT/T, where T represents set film thickness of the second interconnection layer in a direction approximately vertical to the bottom surface, BMT represents film thickness of the bottom barrier metal layer, BMTmin represents minimum necessary film thickness of the bottom barrier metal layer and KT represents tolerable rate of increase in resistance of the second interconnection layer when the set film thickness T is decreased by ΔT.

In this case also, as in the method of determining the total film thickness BM of the barrier metal layer described above, in order for the rate of increase in resistance of the second interconnection layer to be not higher than the tolerable rate of increase KT when the set film thickness T of the second interconnection layer is decreased by ΔT, the film thickness BMT of the bottom barrier metal layer must be selected to satisfy the relation given by the expression (8). The expressions described above can be transformed to expression (9) below.

As the minimum necessary film thickness of the bottom barrier metal layer is BMTmin, the film thickness BMT of the bottom barrier metal layer must also satisfy the relation represented by the expression (10).

As a result, if the film thickness BMT of the barrier metal layer is determined to satisfy the relation (11), it is possible for the bottom barrier metal layer to exhibit necessary function and for the rate of increase in resistance of the second interconnection layer to be not higher than the tolerable rate of increase KT.

$$\frac{\rho}{(W - BM) \times (T - \Delta T - BMT)} \leq KT \times \frac{\rho}{(W - BM) \times (T - BMT)} \qquad (8)$$

$$\frac{BMT}{T} \leq 1 - \frac{KT}{KT-1} \times \frac{\Delta T}{T} \qquad (9)$$

$$\frac{BMT\ \min}{W} \leq \frac{BMT}{T} \qquad (10)$$

$$\frac{BMT\ \min}{T} \leq \frac{BMT}{T} \leq 1 - \frac{KT}{KT-1} \times \frac{\Delta T}{T} \qquad (11)$$

In a method of designing a semiconductor circuit in accordance with another aspect of the present invention is to design a semiconductor device including a first interconnection layer having relatively short line length, a first insulator formed to surround the first interconnection layer, a second interconnection layer having longer line length than the first interconnection layer and a second insulator formed to surround the second interconnection layer, and the method includes the following steps. A first interconnection structure pattern including a plurality of interconnection layers having a prescribed distance between interconnection lines and containing a specified material, and an insulator formed to surround each of the plurality of interconnection layers and containing a specified material is prepared. A second interconnection structure pattern including a plurality of interconnection layers having approximately the same distance between interconnection lines as the distance between interconnection lines of the first interconnection structure pattern and containing a specific material, and an insulator formed to surround each of the plurality of interconnection layers and containing a specific material is prepared. In the first interconnection structure pattern, a first parasitic capacitance of each interconnection layer is calculated. In the second interconnection structure pattern, a second parasitic capacitance for each interconnection layer is calculated. The material of the interconnection layer of the first or second interconnection structure pattern having smaller one of the first and second parasitic capacitances is selected as a material to be contained in the first interconnection layer. A material of the insulator in the first or second interconnection structure pattern having smaller one of the first and second parasitic capacitances is selected as a material to be contained in the first insulator.

Accordingly, it is possible to provide a semiconductor circuit having smaller parasitic capacitance in the first interconnection layer of which reduction in parasitic capacitance is effective in improving speed of operation of the semiconductor device. As a result, higher speed of operation of the semiconductor device can readily be attained. Accordingly, a semiconductor device having an interconnection structure of superior electrical characteristics can be obtained.

The method of designing a semiconductor circuit in accordance with the above described another aspect may further includes the following steps. The first line resistance of each interconnection layer in the first interconnection structure pattern is calculated. The second line resistance of each interconnection layer of the second interconnection structure pattern is calculated. By multiplexing the first parasitic capacitance and the first line resistance, a first evaluation value is calculated for the first interconnection structure pattern. By multiplexing the second parasitic capacitance and the second line resistance in the second interconnection structure pattern, a second evaluation value is calculated. The material of the interconnection layer of the first or second interconnection structure patterns having smaller one of the first and second evaluation values is used as the material to be contained in the second interconnection layer. The material of the insulator in the first or second interconnection structure pattern having smaller one of the first and second evaluation value is selected as a material to be contained in the second insulator.

Here, a semiconductor circuit having a small evaluation value for the second interconnection layer can readily be obtained. Here, the second interconnection layer has longer line length than the first interconnection layer, and corresponds to the lines for connecting circuit blocks. In the second interconnection layer having relatively long line length, it is effective to improve speed of operation and lower power consumption of the semiconductor device to reduce the evaluation value obtained by multiplexing the parasitic capacitance and the line resistance. Therefore, a semiconductor device adapted to improve speed of operation and to reduce power consumption can readily be obtained.

In the method of designing a semiconductor circuit in accordance with the above described another aspect, the first and second interconnection structure patterns may be one selected from the group consisting of an interconnection structure pattern using aluminum as the material of the interconnection layer, an interconnection structure pattern using copper as the material of the interconnection layer, and an interconnection structure pattern using copper as the material of the interconnection layer with film thickness of the interconnection layer being determined to attain approximately the same line resistance as the interconnection layer of the interconnection structure pattern using aluminum as the material of the interconnection layer.

Here, higher speed of operation and lower power consumption can readily be attained in a semiconductor circuit using, as a material of the interconnection layer, aluminum or copper.

In the method of designing a semiconductor circuit in accordance with the above described another aspect, the distance between interconnections may be approximately the same as the minimum processing dimension in the step of photolithography used in manufacturing a semiconductor device.

In the method of manufacturing a semiconductor device in accordance with a further aspect of the present invention, the method of designing a semiconductor circuit in accordance with the above described another aspect is utilized.

Therefore, even when miniaturized, a semiconductor device attaining higher speed of operation and lower power consumption can readily be obtained.

The semiconductor device in accordance with a still further aspect of the present invention includes an interconnection layer and a barrier metal layer. The interconnection layer has one side surface and the other side surface positioned opposite to the one side surface. The barrier metal layer is formed on the one side surface and the other side surface. Total film thickness BM of the barrier metal layer is selected to satisfy the relation of $BMmin/W \leq BM/W \leq 1-(K/(K-1)) \times \Delta W/W$, where W represents set line width of the interconnection layer in a direction approximately vertical to the one side surface, BM represents total film thickness of the barrier metal layer formed on the one side surface and the other side surface, BMmin represents minimum necessary film thickness of the barrier metal layer and K represents tolerable rate of increase in resistance of the interconnection layer when the set line width W is decreased by $\Delta W$.

Therefore, as in the semiconductor device in accordance with the above described one aspect, the total film thickness BM of the barrier metal layer is selected to satisfy the above described relation, and therefore the function of the barrier metal layer is surely exhibited, and the ratio of increase in the line resistance can be made not higher than the tolerable ratio of increase K. Therefore, increase in line resistance to be higher than that tolerable ratio of increase K can surely be prevented. As a result, degradation of electrical characteristics such as lower speed of operation of the semiconductor device caused by the increased line resistance can surely be prevented.

In the semiconductor device in accordance with the above described still further aspect, the interconnection layer has a bottom surface on which a bottom barrier metal layer is formed. Total film thickness BMT of the bottom barrier metal layer may be selected to satisfy the relation of $BMmin/T \leq BMT/T \leq 1-(KT/(KT-1)) \times \Delta T/T$, where T represents set film thickness of the interconnection layer in a direction approximately vertical to the bottom surface, BMT represents film thickness of the bottom barrier metal layer, BMTmin represents minimum necessary film thickness of the bottom barrier metal layer and KT represents tolerable rate of increase in resistance of the interconnection layer when the set film thickness T is decreased by $\Delta T$.

In this case, as in the semiconductor device in accordance with the above described one aspect, the total film thickness BMT of the bottom barrier metal layer is selected to satisfy the above described relation. Therefore, the barrier metal layer surely exhibits its functions and the rate of increase in the resistance of interconnection layer can be made not higher than the tolerable rate of increase KT.

A CMOS (Complementary Metal Oxide Semiconductor) logic circuit device in accordance with a still further aspect of the present invention includes a semiconductor substrate, a conductive region, a first interconnection layer, a first insulator, a second interconnection layer and a second insulator. The semiconductor substrate has a main surface. The conductive region is formed on the main surface of the semiconductor substrate. The first interconnection layer is electrically connected to the conductive region, has a relatively short line length and contains a material having relatively high electrical resistance. The first insulator is formed to surround the first interconnection layer and has relatively low dielectric constant. The second interconnection layer is formed on the main surface of the semiconductor substrate, contains a material having lower electrical resistance than the material contained in the first interconnection layer, and has longer line length than the first interconnection layer. The second insulator is formed to surround the second interconnection layer and has higher dielectric constant than the first insulator.

Therefore, the CMOS logic circuit device in accordance with the still further aspect provides similar effects as provided by the semiconductor device in accordance with the above described one aspect, as the logic circuit device has similar structure as the semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in the following with reference to the figures.

First Embodiment

The inventors studied the relation between the speed of operation of a semiconductor device and interconnection structure and materials of the insulator and interconnection layers of the semiconductor device. More specifically, relation between inverter delay time and line length and interconnection material of such a circuit as shown in FIG. 1 has been studied by simulation.

Figure 1:
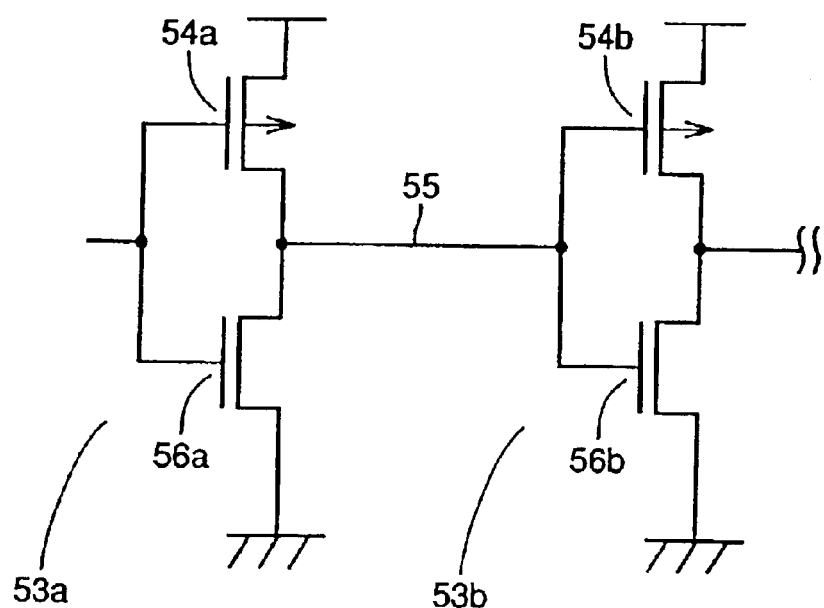
FIG. 1 is an equivalent circuit diagram of a semiconductor circuit studied by the inventors.

Referring to FIG. 1, the circuit studied by the inventors includes a plurality of inverter circuits 53a and 53b. Inverter circuits 53a and 53b are connected in series by an interconnection 55. Inverter circuit 53a includes a p type MOS transistor 54a and an n type MOS transistor 56a. Inverter circuit 53b includes a p type MOS transistor 54b and an n type MOS transistor 56b.

The interconnection structure of the semiconductor circuit studied by the inventors will be described with reference to FIGS. 2 and 3.

Figure 2:
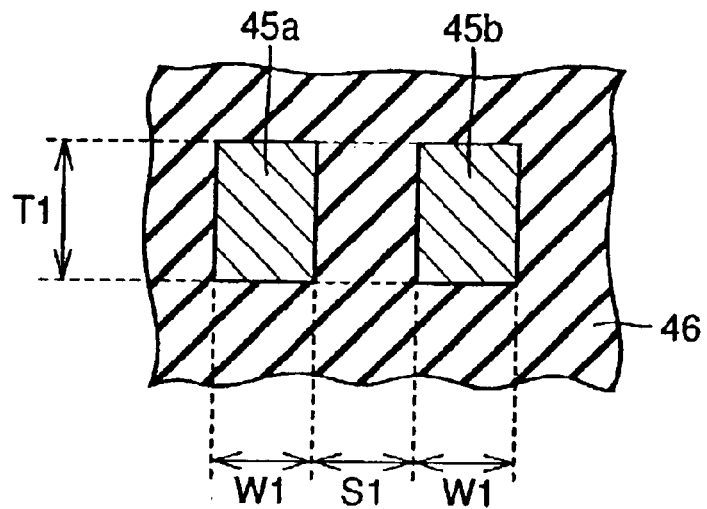
FIG. 2 is a schematic cross section representing an example of an interconnection shown in FIG. 1.

Referring to FIG. 2, one of the interconnection structures studied by the inventors includes interconnections 45a and 45b of aluminum formed surrounded by an interlayer insulating film 46 of fluorine added silicon oxide film (SiOF). Interconnections 45a and 45b have film thickness T1 of 0.53 $\mu$m. Interconnections 45a and 45b have line width W1 of 0.3 $\mu$m. Distance S1 between the interconnections is 0.3 $\mu$m. Interlayer insulating film 46 has specific dielectric constant of about 3.5.

Figure 4:
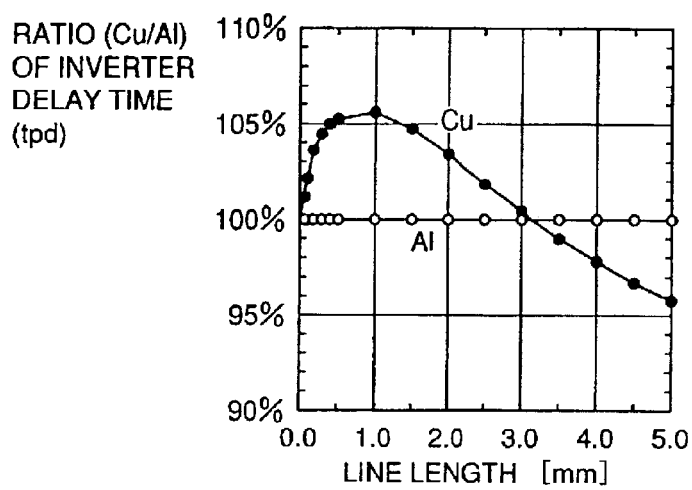
FIG. 4 is a graph representing relation between line length and ratio of inverter delay time in the circuit shown in FIG. 1.

The interconnection formed of aluminum having such a cross sectional shape was used as the interconnection 55 of the circuit shown in FIG. 1, and inverter delay time of the circuit shown in FIG. 1 was measured with the line length of interconnection 55 varied. The result is as shown in FIG. 4.

The inventors also studied an interconnection using copper as the interconnection material. FIG. 3 shows a cross sectional structure of the interconnection using copper.

Figure 3:
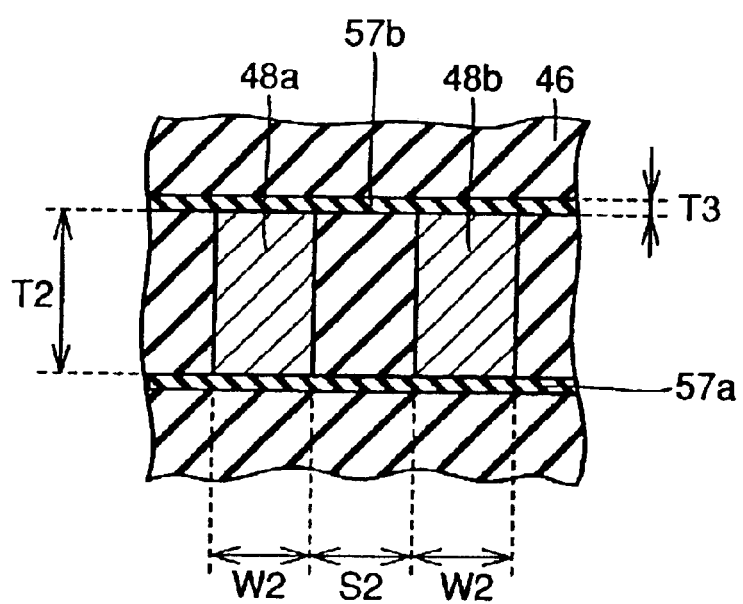
FIG. 3 is a schematic cross section representing another example of the interconnection shown in FIG. 1.

Referring to FIG. 3, interconnections 48a and 48b of copper are formed to be surrounded by an interlayer insulating film 46 formed of SiOF. It is noted that above and below interconnections 48a and 48b, silicon nitride films 57a and 57b serving as an etching stopper in Damascene process for forming the copper interconnections 48a and 48b are formed. Film thickness T2, line width W2 and distance S2 between interconnections of interconnections 48a and 48b are the same as film thickness T1, line width W1 and distance S1 of the interconnections 45a and 45b in the interconnection structure shown in FIG. 2, respectively. Film thickness T3 of silicon nitride films 57a and 57b is 50 nm.

The interconnection formed of copper having such cross sectional shape was used as the interconnection 55 of the circuit shown in FIG. 1, and inverter delay time in the circuit shown in FIG. 1 was measured in the similar manner with the line length of interconnection 55 varied. The result is as shown in FIG. 4.

Referring to FIG. 4, the abscissa represents line length of interconnection 55 (see FIG. 1), and the ordinate represents the ratio of inverter delay time (tpd) when the aluminum interconnection and the copper interconnection of the same line length were used.

Referring to FIG. 4, up to the line length of about 3 mm, the interconnection formed of aluminum has shorter inverter delay time than the interconnection of copper.

Here, referring to FIGS. 2 and 3, as to line resistance, line resistance of copper interconnections 48a and 48b is smaller than the line resistance of aluminum interconnections 45a and 45b. As to the insulator formed to surround interconnections 45a, 45b, 48a and 48b, in the interconnection structure shown in FIG. 2, only the interlayer insulating film 46 is formed around interconnections 45a and 45b. In the interconnection structure in FIG. 3, interlayer insulating film 46 and silicon nitride films 57a, 57b are formed around interconnections 48a and 48b. Silicon nitride films 57a and 57b have specific dielectric constant of about 7 to about 9, which is higher than that of SiOF or silicon oxide film, used as the interlayer insulating film 46. Therefore, in the interconnection structure shown in FIG. 3, the overall specific dielectric constant of the insulator formed around interconnections 48a and 48b is higher than the specific dielectric constant of the insulator in the interconnection structure shown in FIG. 2. As a result, in the interconnection structure shown in FIG. 3, parasitic capacitance of interconnections 48a and 48b is larger than the parasitic capacitance of interconnections 45a and 45b in the interconnection structure of FIG. 2.

As can be seen from FIG. 4, for a short interconnection having the line length of shorter than 3.0 mm, inverter delay time is smaller when aluminum interconnections 45a, 45b such as shown in FIG. 2 are used, than when copper interconnection is used. This represents that for a short interconnection, reduction in parasitic capacitance of the interconnection is more effective in reducing inverter delay time, that is, in improving speed of operation of the semiconductor device.

On the other hand, for a long interconnection having the line length of 3.0 mm or longer, inverter delay time is shorter when copper interconnections 48a, 48b shown in FIG. 3 are used. This means that for a long interconnection, influence of line resistance on the inverter delay time is increased. More specifically, reduction in evaluation value obtained by multiplying parasitic capacitance by line resistance of the interconnection (hereinafter referred to as RC value) is more effective in reducing inverter delay time, that is, in improving speed of operation of the semiconductor device.

Here, interconnections 45a and 45b containing aluminum such as shown in FIG. 2 has specific resistance of about 3 $\mu\Omega$cm, and interconnections 48a and 48b containing copper such as shown in FIG. 3 has specific resistance of about 2 $\mu\Omega$cm.

A semiconductor device manufactured in view of the findings described above is depicted in FIG. 5. The semiconductor device will be described with reference to FIG. 5.

Figure 5:
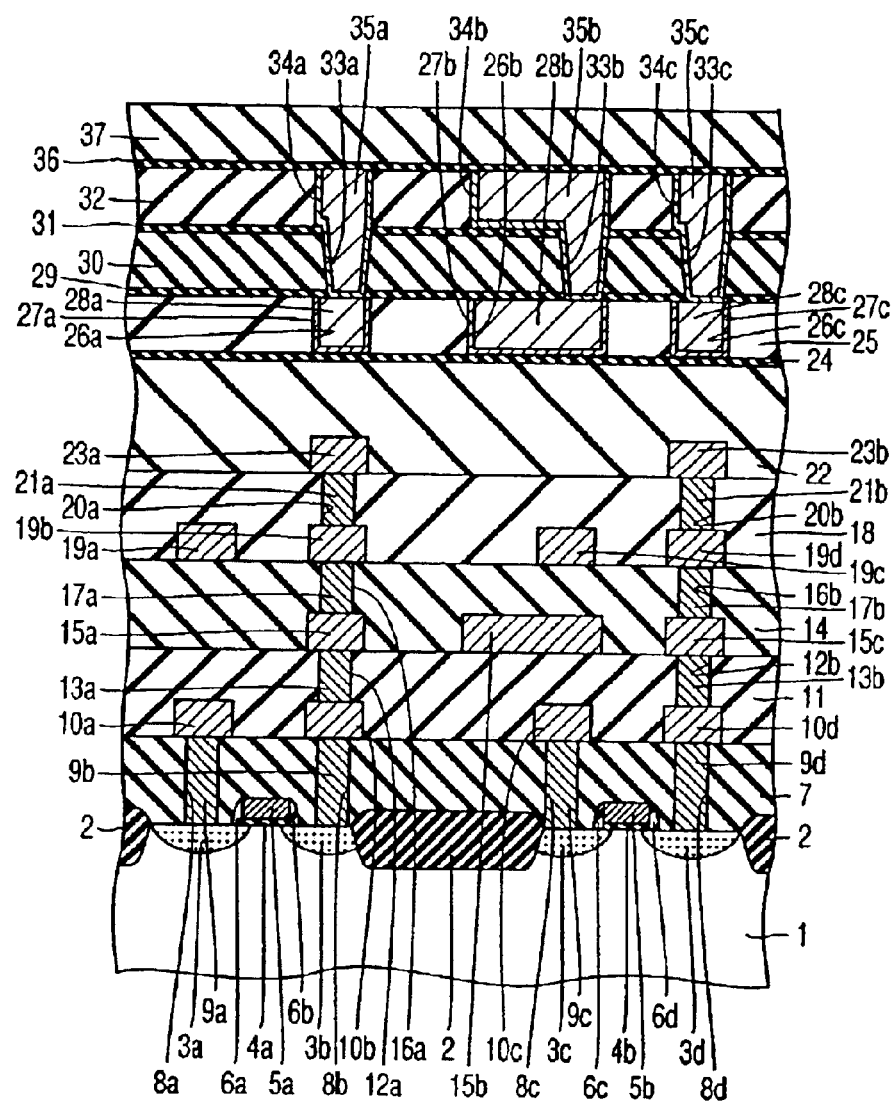
FIG. 5 is a schematic cross section representing a first embodiment of the semiconductor device in accordance with the present invention.

Referring to FIG. 5, an isolating insulating film 2 is formed to surround a conductive region on the main surface of a semiconductor substrate 1. On the conductive region on the main surface of the semiconductor substrate 1, source/drain regions 3a to 3d are formed to be adjacent to channel regions. On regions positioned above channel regions on the main surface of semiconductor substrate 1, gate electrodes 5a and 5b are formed with gate insulating films 4a and 4b interposed. On sidewalls of gate electrodes 5a and 5b, sidewall films 6a to 6d are formed. On gate electrodes 5a and 5b, sidewall films 6a to 6d and source/drain regions 3a to 3d, a first interlayer insulating film 7 is formed.

At regions positioned above source/drain regions 3a to 3d, contact holes 8a to 8d are formed by partially removing interlayer insulating film 7. In contact holes 8a to 8d, tungsten plugs 9a to 9d are formed. On tungsten plugs 9a to 9d, interconnections (AlCu interconnections) 10a to 10d formed of a material containing aluminum-copper alloy as a main component are formed as a first metal layer. On AlCu interconnections 10a to 10d and first interlayer insulating film 7, a second interlayer insulating film 11 is formed.

At regions positioned above AlCu interconnections 10b and 10d, contact holes 12a and 12b are formed by partially removing interlayer insulating film 11. In contact holes 12a and 12b, tungsten plugs 13a and 13b are formed. On tungsten plugs 13a and 13b, AlCu interconnections 15a, 15c as a second metal layer are formed to be electrically connected to tungsten plugs 13a and 13b. At a region positioned above AlCu interconnections 10c, an AlCu interconnection 10b as the second metal layer is formed on an upper surface of interlayer insulating film 11.

On AlCu interconnections 15a to 15c and the second interlayer insulating film 11, a third interlayer insulating film 14 is formed. At regions positioned above AlCu interconnections 15a and 15c, contact holes 16a and 16b are formed by partially removing interlayer insulating film 14. In contact holes 16a and 16b, tungsten plugs 17a and 17b are formed. On tungsten plugs 17a and 17b, AlCu interconnections 19b and 19d as a third metal layer are formed. On an upper surface of the third interlayer insulating film 14, AlCu interconnections 19a and 19c are formed as the third metal layer. On AlCu interconnections 19a to 19d and the third interlayer insulating film 14, a fourth interlayer insulating film 18 is formed.

At regions positioned above AlCu interconnections 19b and 19d, contact holes 20a and 20b are formed by partially removing interlayer insulating film 18. In contact holes 20a and 20b, tungsten plugs 21a and 21b are formed. On tungsten plugs 21a and 21b, AlCu interconnections 23a, 23b as a fourth metal layer are formed. On the fourth interlayer insulating film 18 and AlCu interconnections 23a, 23b, a fifth interlayer insulating film 22 is formed.

On the fifth interlayer insulating film 22, a silicon nitride film 24 is formed. On silicon nitride film 24, a sixth interlayer insulating film 25 is formed. By partially removing interlayer insulating film 25, trenches 26a to 26c are formed. In trenches 26a to 26c, barrier metals 27a to 27c are formed. On barrier metals 27a to 27c, interconnections formed of a material mainly containing copper as the fifth metal layer (Cu interconnections) 28a to 28c are formed to fill trenches 26a to 26c.

On interlayer insulating film 25 and Cu interconnections 28a to 28c, a silicon nitride film 29 is formed. On silicon nitride film 29, a seventh interlayer insulating film 30 is formed. On interlayer insulating film 30, a silicon nitride film 31 is formed. On silicon nitride film 31, an eighth interlayer insulating film 32 is formed. By removing interlayer insulating films 30 and 32 by dual Damascene process, trenches 33a to 33c are formed. In trenches 33a to 33c, barrier metals 34a to 34c are formed. On barrier metals 34a to 34c, Cu interconnections 35a to 35c as a sixth metal layer are formed to fill trenches 33a to 33c. On interlayer insulating film 32 and Cu interconnections 35a to 35c, a silicon nitride film 36 is formed. On silicon nitride film 36, a passivation film 37 is formed.

AlCu interconnections 10a to 10d, 15a to 15c, 19a to 19d, 23a and 23b as the first to fourth metal layers are short interconnections having relatively short line lengths used for connecting elements in a circuit block, for example. In place of the interconnection formed of a material containing an aluminum-copper alloy as a main component (AlCu interconnection), an interconnection formed of a material containing aluminum as a main component (Al interconnection) may be used.

Cu interconnections 28a to 28c and 35a to 35c as the fifth and sixth metal layers are long interconnections having relatively long line lengths used for connecting circuit blocks, for example. Line resistance of AlCu interconnections 10a to 10d, 15a to 15c, 19a to 19d, 23a and 23b (hereinafter referred to as lower layer interconnections) is larger than that of Cu interconnections 28a to 28c and 35a to 35c (hereinafter referred to as upper layer interconnections).

Interlayer insulating films 7, 11, 14, 18 and 22 which are insulators formed around the lower layer interconnections are of silicon oxide film or silicon oxide film with fluorine added (SiOF). The insulator formed around the upper layer interconnections include interlayer insulating films 25 and 30 formed of silicon oxide film or fluorine added silicon oxide film (SiOF) and silicon nitride films 24, 29, 31 and 36. Silicon nitride films 24, 29, 31 and 36 have higher specific dielectric constant than silicon oxide film or SiOF.

As a result, the specific dielectric constant of the insulators as a whole formed around the upper layer interconnections is higher than the specific dielectric constant of the insulators formed around the lower layer interconnections. Interlayer insulating films 7, 11, 14, 18, 22, 25, 30 and 32 may be formed of a silicon oxide film.

As can be seen from FIG. 5, when the line distance and cross sectional area of lines in the upper layer interconnections and lower layer interconnections are approximately the same, parasitic capacitance of the lower layer interconnections can be made smaller than that of the upper layer interconnections, as the specific dielectric constant of the insulators around the lower layer interconnections is lower than the specific dielectric constant of the insulators formed around the upper layer interconnections. Here, in the lower layer interconnections which are short lines, reduction in parasitic capacitance of the interconnections is especially effective in improving the speed of operation of the semiconductor device. As a result, in the semiconductor device shown in FIG. 5, signal delay in the lower layer interconnections, which are short lines, can effectively be prevented, and hence speed of operation of the semiconductor device can be improved.

In the upper layer interconnections which are long lines, reduction in the evaluation value (RC value) obtained by multiplying the parasitic capacitance of the interconnections by the line resistance is more effective in improving the speed of signal transmission over the interconnections. In the semiconductor device shown in FIG. 5, as Cu interconnections are used as the upper layer interconnections, line resistance of the upper layer interconnections can be made smaller than that of the lower layer interconnections. As a result, higher speed of operation of the semiconductor device is effectively attained.

Further, as the line resistance of the upper layer interconnections can be made smaller, power consumption of the semiconductor device can be reduced.

As a result, a semiconductor device having an interconnection structure of superior electrical characteristics is obtained.

Further, as long lines and short lines are formed separately in different layers, circuit design of the semiconductor device can be simplified.

Further, as long lines and short lines are formed separately on semiconductor substrate, interconnection structure of the semiconductor device can be made simple as compared when long and short lines are formed mixedly.

Further, as the long lines and short lines are formed in different layers, materials of the interconnections and of insulators within one layer can be made uniform. Therefore, even when the materials of the interconnections and of the insulators are to be changed between the long lines and the short lines, the steps of manufacturing the semiconductor is not complicated. Therefore, increase in manufacturing cost of the semiconductor device can be prevented.

Further, as can be seen from FIG. 5, as short lines are formed in a layer closer to the main surface of the semiconductor substrate and long lines are formed in a layer positioned upper than the short lines, it is unnecessary to detour positions where short lines are formed, when interconnection path of the long lines is determined. This simplifies interconnection path of the long lines, and hence enables reduction in line length. As a result, the overall line length can be reduced. This prevents signal delay caused by long line length. Therefore, higher speed of operation and lower power consumption of the semiconductor device can be attained.

Further, as the AlCu interconnections and Al interconnections which have been conventionally used are employed as the lower layer interconnections, the manufacturing apparatuses and know-how of manufacturing the conventional semiconductor devices can be utilized. As a result, cost for new investment and research and development can be reduced. As a result, the cost of manufacturing the semiconductor device can be reduced and semiconductor devices can be manufactured readily.

Further, as the Cu interconnections having lower electrical resistance than the conventional aluminum are used as the upper layer interconnections, signal delay in the interconnections can further be suppressed, and higher speed of operation and lower power consumption of the semiconductor device can be attained.

Silicon nitride films 24, 29, 31 and 36 formed around the upper layer interconnections are utilized as etching stopper in Damascene process when Cu interconnection 28a to 28c and 35a to 35c are formed.

Figure 6:
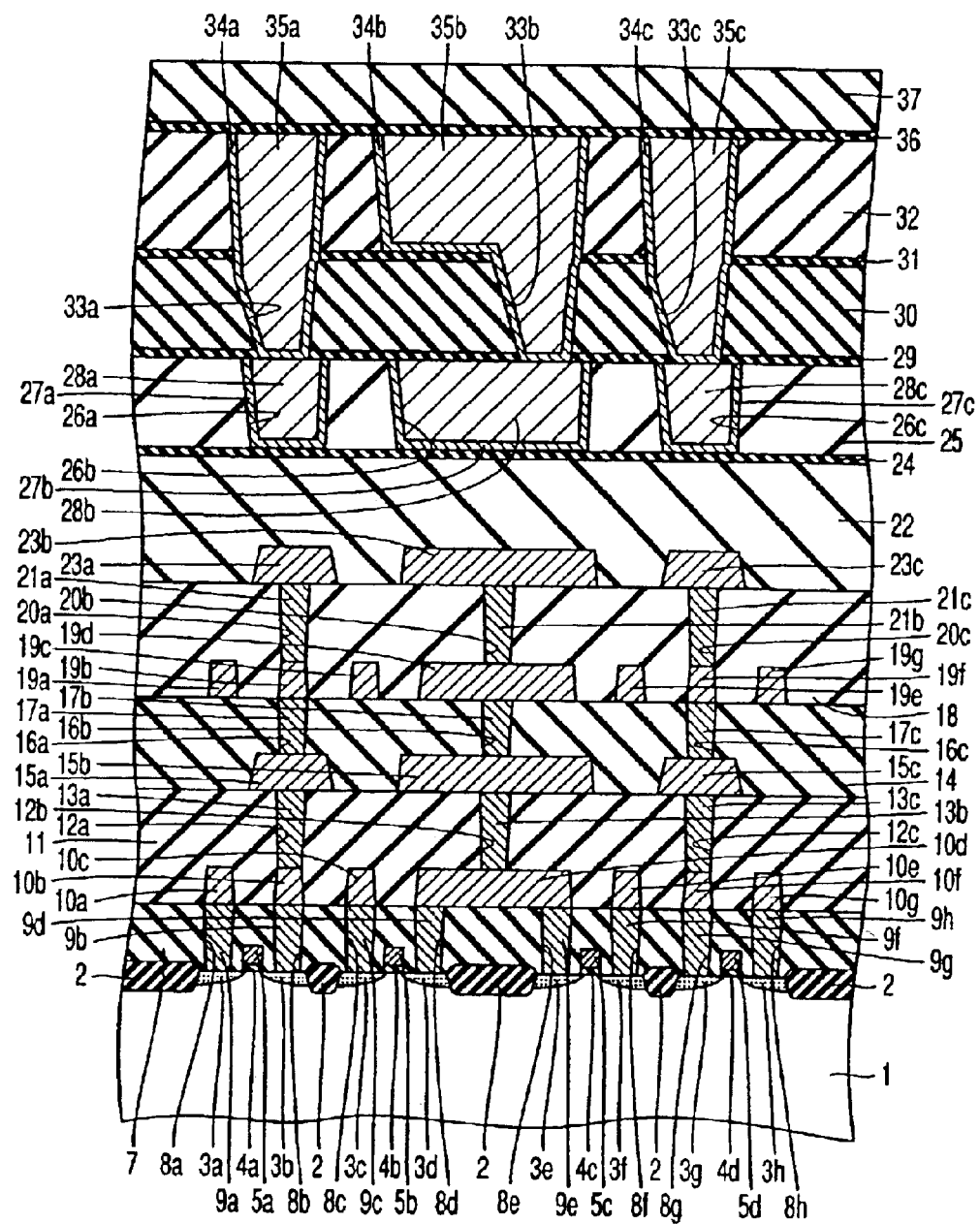
FIG. 6 is a schematic cross section representing a modification of the first embodiment of the semiconductor device in accordance with the present invention.

Referring to FIG. 6, the semiconductor device is a CMOS logic circuit device and basically, the structure is similar to that of the semiconductor device shown in FIG. 5. In the semiconductor device of FIG. 6, however, four field effect transistors including source/drain regions 3a to 3h, gate insulating film 4a to 4d and gate electrodes 5a to 5d, respectively are formed in the conductive region surrounded by the isolating insulating film 2 on the main surface of semiconductor substrate 1.

On the first interlayer insulating film 7, AlCu interconnections 10a to 10g as the first metal layer are formed. AlCu interconnections 10a to 10g are electrically connected to source/drain regions 3a to 3h through tungsten plugs 9a to 9h formed in contact holes 8a to 8h. On the second interlayer insulating film 11, AlCu interconnections 15a to 15c as the second metal layer are formed. AlCu interconnections 15a to 15c are electrically connected to AlCu interconnections 10b, 10d and 10f through tungsten plugs 13a to 13c formed in contact holes 12a to 12c, respectively.

On the third interconnection insulating film 14, AlCu interconnections 19a to 19g as the third metal layer are formed. AlCu interconnections 19b, 19d and 19f are electrically connected to AlCu interconnections 15a to 15c through tungsten plugs 17a to 17c formed in contact holes 16a to 16c, respectively. On the fourth interlayer insulating film 18, AlCu interconnections 23a to 23c as the fourth metal layer are formed. AlCu interconnections 23a to 23c are electrically connected to AlCu interconnections 19b, 19d and 19f through tungsten plugs 21a to 21c formed in contact holes 20a to 20c, respectively.

The structure on silicon nitride film 24 is approximately the same as that of the semiconductor device shown in FIG. 5, except that Cu interconnections 28a to 28c and 35a to 35c have wider line width and thicker film thickness than AlCu interconnections 10a to 10g, 15a to 15c, 19a to 19g and 23a to 23c as the lower layer interconnections. Further, distance between lines of Cu interconnections 28a to 28c and 35a to 35c as the upper layer interconnections is larger than the distance between lines in the lower layer interconnections.

The semiconductor device having such a structure provides similar effects as the semiconductor device shown in FIG. 5. Further, as the cross sectional area of the upper layer interconnections is made larger than the cross sectional area of the lower layer interconnections, line resistance of the upper layer interconnections can further be decreased. As a result, the RC value of the upper layer interconnections can further be reduced, and hence, higher speed of operation and lower power consumption of the semiconductor device can be attained.

In the lower layer interconnections, cross sectional area of the short lines (lower layer interconnections) is made small. More specifically, film thickness of short lines is reduced, so as to suppress increase in parasitic capacitance of interconnections even when the distance between interconnections is reduced. When the cross sectional area of the interconnections is reduced, line resistance increases. However, for a short line, reduction in parasitic capacitance of the interconnection is more effective in improving the speed of operation of the semiconductor device. Therefore, in the semiconductor device such as shown in FIG. 6, higher speed of operation of the semiconductor device can be realized as a result. Even when line resistance is increased as the cross sectional area of the line is reduced, increase in line resistance caused by relative reduction in cross sectional area of the line does not present a significant problem, as the ON resistance of the transistor constituting the semiconductor circuit is relatively large, i.e., about several kilo ohms.

Further, as can be seen from FIG. 6, by enlarging the distance between lines in the upper layer interconnections to be larger than the distance between lines in the lower layer interconnections, parasitic capacitance of the lines in the upper layer interconnections can further be reduced. As a result, the RC value of the upper layer interconnections can further be reduced, and therefore higher speed of operation and lower power consumption of the semiconductor device can be attained.

Figure 7:
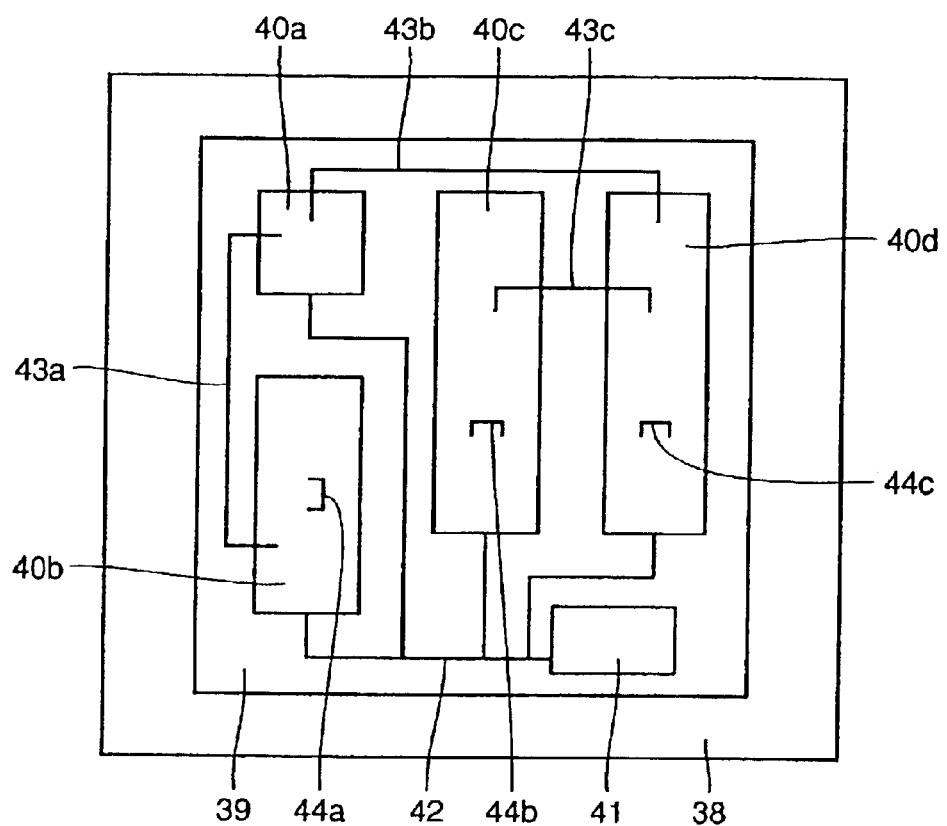
FIG. 7 is a schematic plan view representing the first embodiment of the semiconductor device in accordance with the present invention.

Referring to FIG. 7, the semiconductor device includes an external connection region 38, an interconnection region 39, circuit block regions 40a to 40d and a clock generating region 41. Interblock interconnections 43a to 43c for connecting circuit block regions 40a to 40d with each other and a clock interconnection 42 for connecting clock generating region 41 to circuit block regions 40a to 40d are formed. The interblock interconnections 43a to 43c and clock interconnection 42 are both long lines, which correspond to Cu interconnections 28a to 28c and 35a to 35c shown in FIGS. 5 and 6.

In circuit block regions 40b to 40c, intrablock interconnections 44a to 44c for connecting elements formed in the circuit block regions are formed. The intrablock interconnections 44a to 44c are short lines having relatively short line length, and correspond to AlCu interconnections 10a to 10g, 15a to 15c, 19a to 19g and 23a to 23c shown in FIGS. 5 and 6.

Second Embodiment

Figure 8:
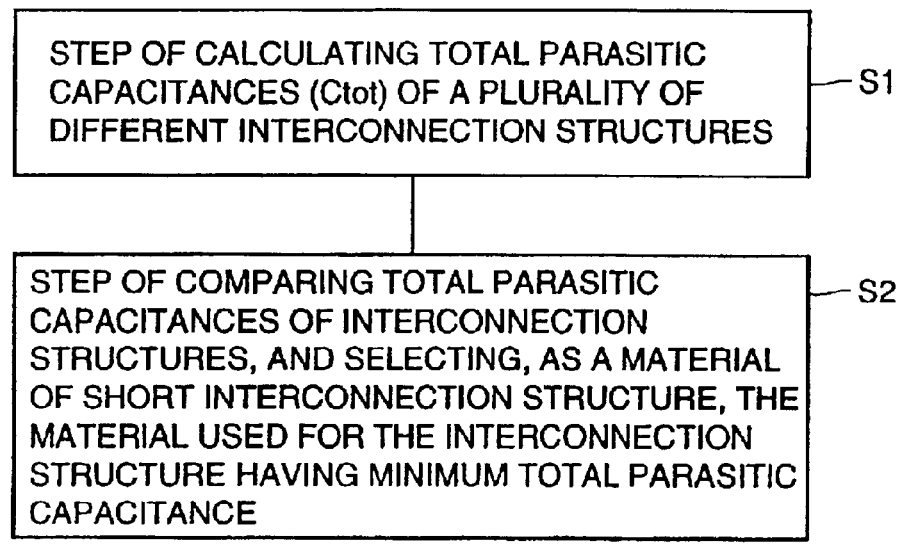
FIG. 8 is a process flow chart related to the second embodiment of a method of designing a semiconductor circuit in accordance with the present invention.

Referring to FIG. 8, the method of designing a semiconductor circuit in accordance with the present invention will be described.

Referring to FIG. 8, first, a plurality of different interconnection structures are prepared. Thereafter, a step (S1) of calculating total parasitic capacitance (Ctot) of each of the plurality of different interconnection structures is performed. Thereafter, a step (S2) of confirming total parasitic capacitances of respective interconnection structures and selecting, as a material of short interconnection structure, the material used for that interconnection structure which has the minimum total parasitic capacitance is performed.

Here, as described in the first embodiment of the present invention, for a short line having relatively short line length, reduction in total parasitic capacitance is especially effective in improving speed of operation of the semiconductor device. Therefore, by the method of designing a semiconductor circuit such as shown in FIG. 8, the speed of operation of the semiconductor device can readily be improved.

Figure 9:
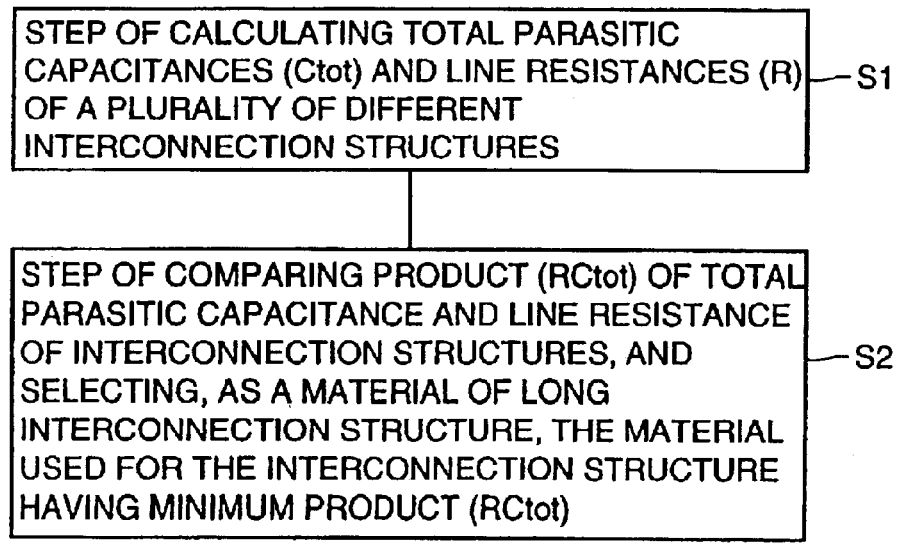
FIG. 9 is a process flow chart representing a modification of the second embodiment of the method of designing a semiconductor circuit in accordance with the present invention.

Referring to FIG. 9, first, a plurality of different interconnection structures are prepared. Thereafter, a step (S1) for calculating total parasitic capacitance (Ctot) and line resistance (R) of each of the plurality of different interconnection structures is performed.

Thereafter, a step (S2) for confirming product (RCtot: evaluation value) of the total parasitic capacitance (Ctot) and the line resistance (R) of the plurality of different interconnection structures, and selecting, as a material of a long line, the material used for that interconnection structure which has the minimum product (RCtot) is performed.

Here, as described in the first embodiment of the present invention, for a long line having relatively long line length, reduction in the product (RCtot) of the total parasitic capacitance and the line resistance is especially effective in improving the speed of operation and reducing power consumption of the semiconductor device. Therefore, when the method of designing a semiconductor circuit shown in FIG. 9 is used, higher speed of operation and lower power consumption of the semiconductor device can readily be attained.

The interconnection structure will be described with reference to FIGS. 10 to 12.

Figure 10:
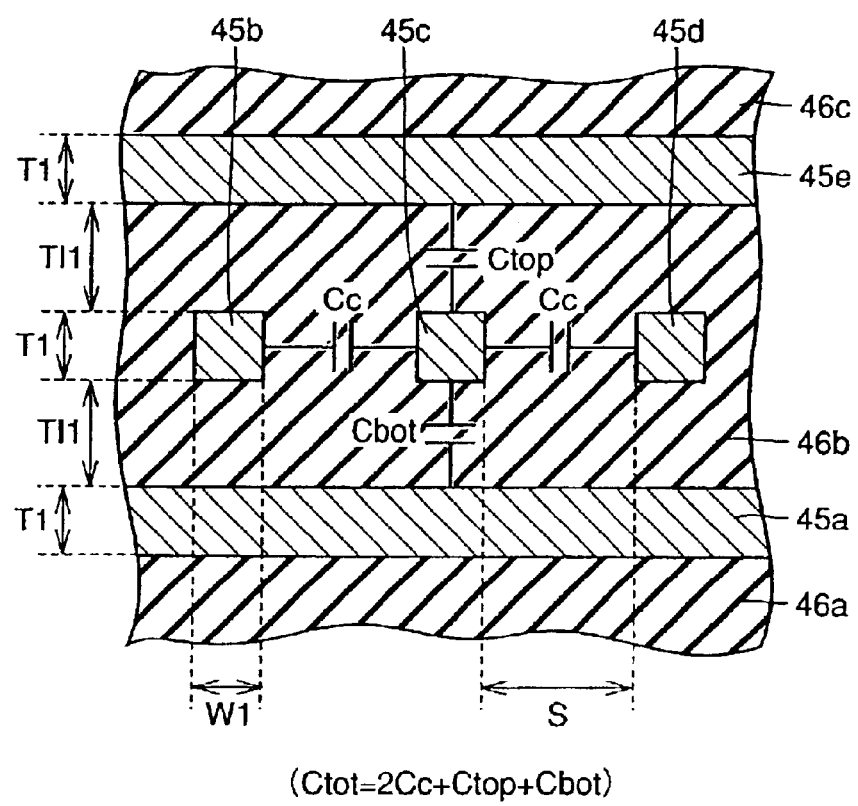
FIGS. 10 to 12 are schematic cross sections representing first to third patterns of interconnection structures used in the method of designing a semiconductor circuit in accordance with the present invention shown in FIGS. 8 and 9, respectively.

Referring to FIG. 10, on an interlayer insulating film 46a formed of SiOF, an Al interconnection 45a is formed. On Al interconnection 45a, Al interconnections 45b to 45d are formed with an interlayer insulating film 46b of SiOF interposed. Al interconnections 45b to 45a are formed to extend in a direction approximately vertical to the direction of extension of Al interconnection 45a. On Al interconnections 45b to 45d, an Al interconnection 45e is formed with an interlayer insulating film 46b interposed. Al interconnection 45e is formed to extend in a direction approximately parallel to the direction of extension of Al interconnection 45a. On Al interconnection 45e, an interlayer insulating film 46c of SiOF is formed.

Here, Al interconnections 45a to 45e each have the same film thickness T1 and same line width W1. Al interconnections 45b to 45d are formed spaced by a line space S. Al interconnections 45a to 45e are formed spaced in the direction of its thickness, by a space TI1.

Here, the total parasitic capacitance Ctot of Al interconnection 45c is represented as a sum of parasitic capacitance (2Cc) with Al interconnections 45b and 45d adjacent in the horizontal direction, parasitic capacitance (Ctop) with Al interconnection 45e, and parasitic capacitance (Cbot) with Al interconnection 45a.

Figure 11:
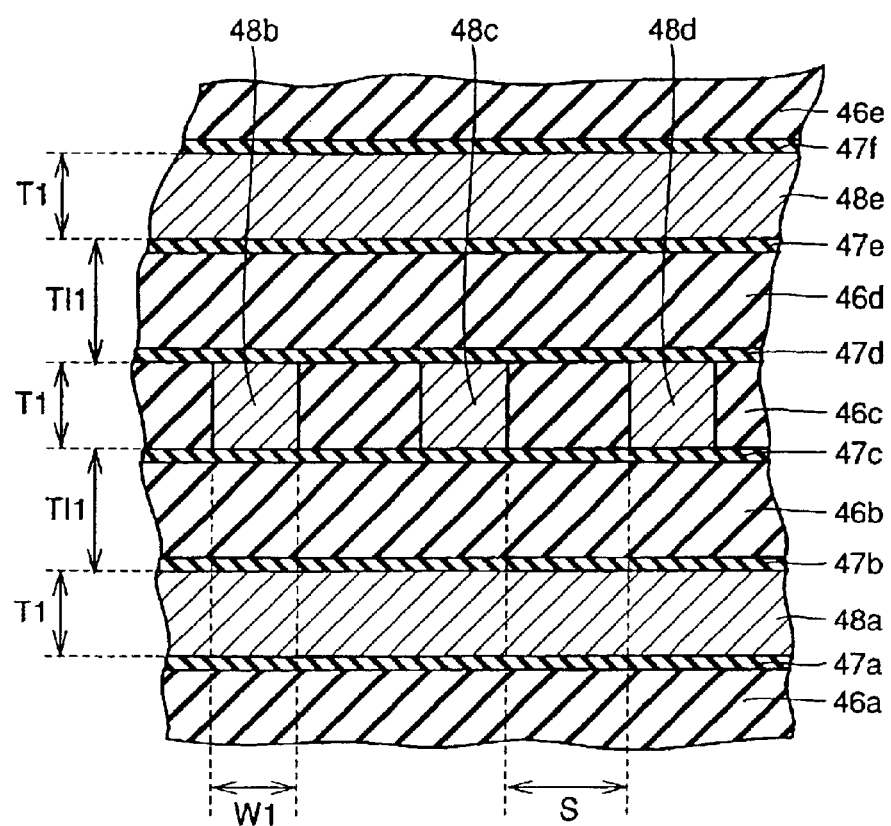

Referring to FIG. 11, the interconnection structure basically has the same structure of the first pattern of the interconnection structure shown in FIG. 10. In the interconnection structure of FIG. 11, however, copper is used as the material of the interconnections and therefore, in place of Al interconnections, Cu interconnections 48a to 48e are formed. Further, as Damascene process is used for forming Cu interconnections, silicon nitride films 47a to 47f used as the etching stopper in Damascene method are formed above and below Cu interconnections 48a to 48e. In the interconnection structure shown in FIG. 11, film thickness T1, line width W1, line space S and space TI1 in the thickness direction of the interconnections of Cu interconnections 48a to 48e are all the same as those of the first pattern of the interconnection structure shown in FIG. 10. The material of interlayer insulating films 46a to 46e are the same as those for the interlayer insulating films 46a to 46c of the first pattern of the interconnection structure shown in FIG. 10.

Figure 12:
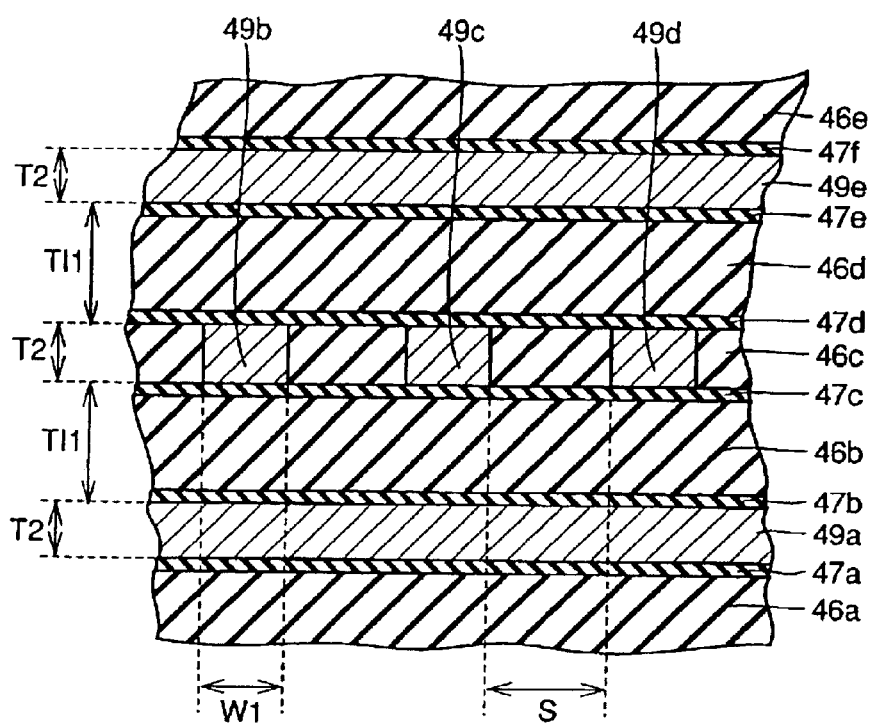

Referring to FIG. 12, the interconnection structure is basically the same as the second pattern of the interconnection structure shown in FIG. 11. Film thickness T2 of Cu interconnections 49a to 49e is, however, determined to be smaller than the film thickness T1 of Cu interconnections 48a to 48e of the interconnection structure shown in FIG. 11. This is because the film thickness T2 of Cu interconnections 49a to 49e is determined such that Cu interconnections 49a to 49e have approximately the same line resistance as the line resistance of Al interconnections 45a to 45e in the first pattern of the interconnection structure shown in FIG. 10. The materials of interlayer insulating films 46a to 46e are the same as those of interlayer insulating films 46a to 46e of the second pattern of the interconnection structure shown in FIG. 11.

Figure 13:
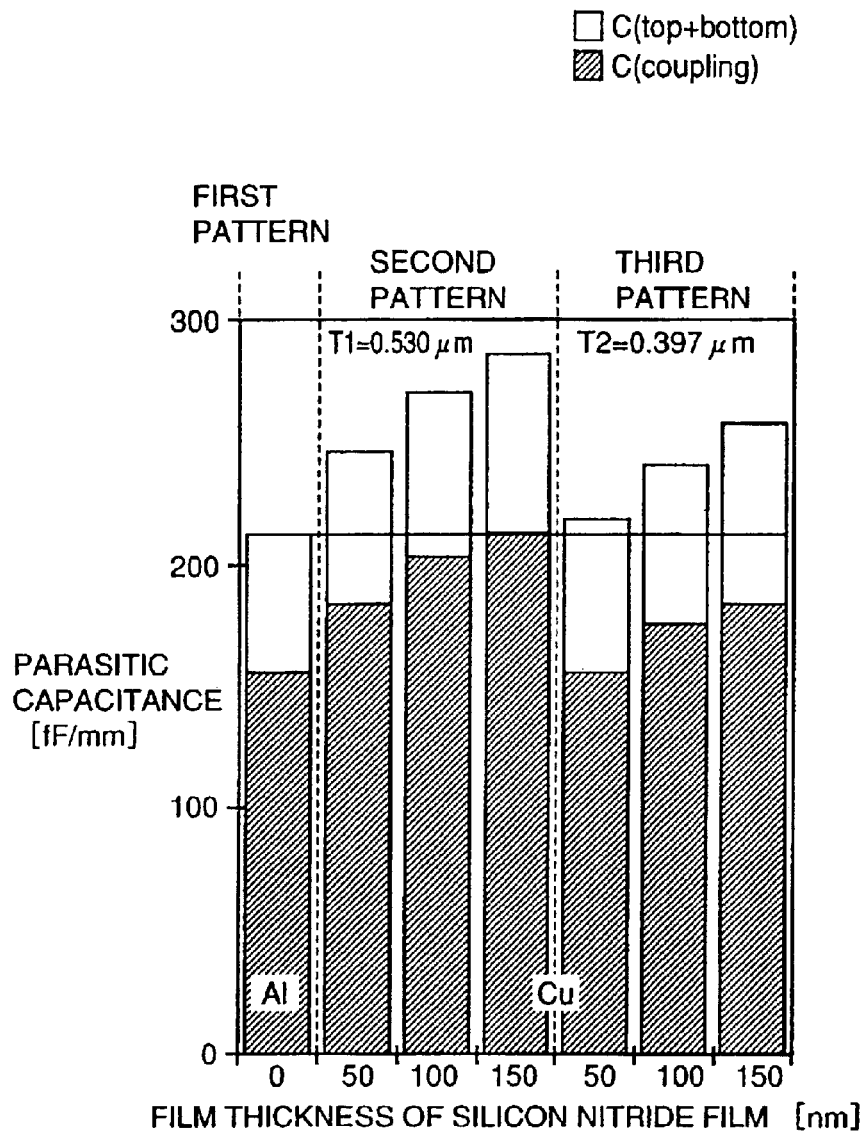
FIG. 13 is a graph representing an example of the result of calculation of parasitic capacitances in the first to third patterns of the interconnection structure shown in FIGS. 10 to 12.

Parasitic capacitances of the first to third patterns shown in FIGS. 10 to 12 are calculated. FIG. 13 shows examples of calculated results.

Referring to FIG. 13, the abscissa represents film thickness of the silicon nitride film in the interconnection structure, and the ordinate represents parasitic capacitance. Basic conditions for the results of calculation shown in FIG. 13 are as follows. Line width W1: 0.3 $\mu$m, line space S: 0.3 $\mu$m, specific dielectric constant of interlayer insulating film: 3.5, film thickness T1 of lines: 0.530 $\mu$m, and film thickness T2: 0.397 $\mu$m. The black portions of the bar graph represent parasitic capacitance (Cc) between lines in the horizontal direction, and white portions represent parasitic capacitances (Ctop, Cbot) in the vertical direction.

Here, line space S is as small as 0.3 $\mu$m, because short line is considered here. As can be seen from FIG. 13, under the above described conditions, the parasitic capacitance is the smallest when the Al interconnection of the first pattern is used.

Here, the line space S may be selected to be approximately the same as minimum dimension in the step of photolithography used in the manufacturing process of the semiconductor circuit. In that case, an example where the parasitic capacitance may possibly be the largest can be verified, and therefore optimal interconnection structure can be selected.

In this manner, it is understood that the parasitic capacitance can best be reduced when the material of the interconnections and the material of the interlayer insulating films used in the first pattern shown in FIG. 10 are used, for short lines. As a result, higher speed of operation of the semiconductor device can be attained.

The line space Tl1 in the thickness direction is selected to be the same as film thickness T1.

Figure 14:
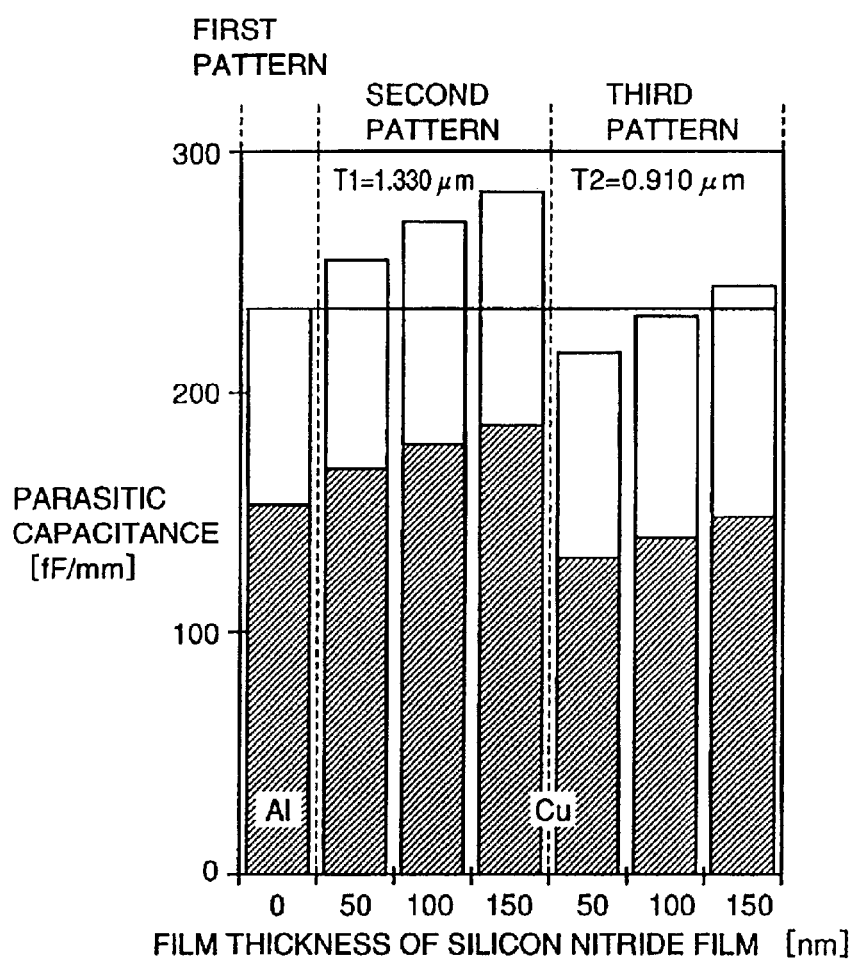
FIG. 14 is a graph showing another example of the result of calculation of parasitic capacitances in the first to third patterns of the interconnection structure shown in FIGS. 10 to 12.

Referring to FIG. 14, the conditions of calculation here are as follows. Line width W1: 0.7 µm, line space S: 0.7 µm, specific dielectric constant of interlayer insulating film: 3.5, film thickness T1 of the interconnection: 1.330 µm, T2: 0.910 µm. Manner of representation of the graph and so on are basically the same as those of FIG. 13.

Referring to FIG. 14, line space S and line width W1 here have relatively large values of 0.7 µm and 0.7 µm, respectively, assuming a long line. It can be understood that in such a case, parasitic capacitance is smaller when the third pattern is used, where thickness of silicon nitride film is 50 nm, rather than the first pattern using Al interconnection.

In this manner, when a semiconductor device is manufactured using the method of designing a semiconductor circuit in accordance with the present invention using the first to third patterns of the interconnection structures such as shown in FIGS. 10 to 12, higher speed of operation and lower power consumption of the semiconductor device in which aluminum or copper is used as the material for interconnections can readily be attained.

Third Embodiment

Figure 15:
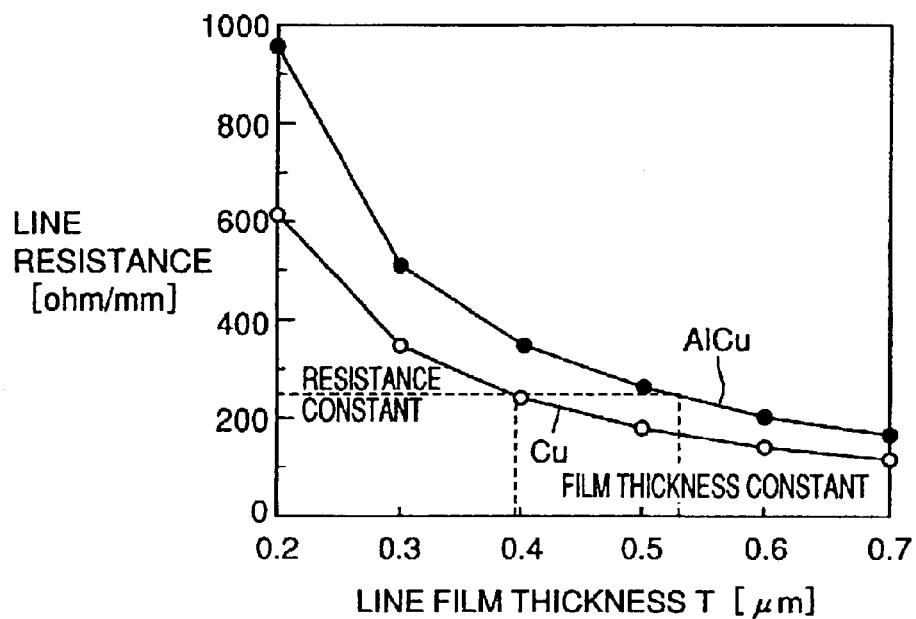
FIG. 15 is a graph representing a relation between interconnection film thickness and line resistance.
Figure 16:
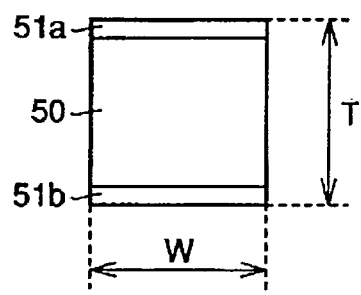
FIG. 16 is a schematic cross section of an AlCu interconnection which is the base of the data shown in FIG. 15.
Figure 17:
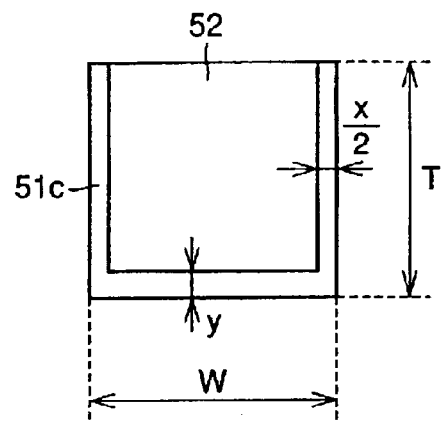
FIG. 17 is a schematic cross section of a Cu interconnection which is the base of the data shown in FIG. 15.

FIGS. 16 and 17 show cross sectional structures of the AlCu interconnection and Cu interconnection which are the base of the data shown in FIG. 15.

Referring to FIG. 16, barrier metals 51a and 51b are formed on the upper surface and bottom surface of AlCu interconnection 50. Total film thickness of AlCu interconnection 50 and barrier metals 51a and 51b are considered the interconnection film thickness T, as shown in FIG. 16. AlCu interconnection has the line width W.

Referring to FIG. 17, on side surfaces and bottom surface of Cu interconnection 52, barrier metal 51c is formed. The interconnection film thickness T represents the total film thickness of Cu interconnection 52 and barrier metal 51c. Line width W represents the total line width of Cu interconnection 52 and barrier metal 51c.

In the data shown in FIG. 15, line width W is a constant value of 0.3 µm.

Figure 18:
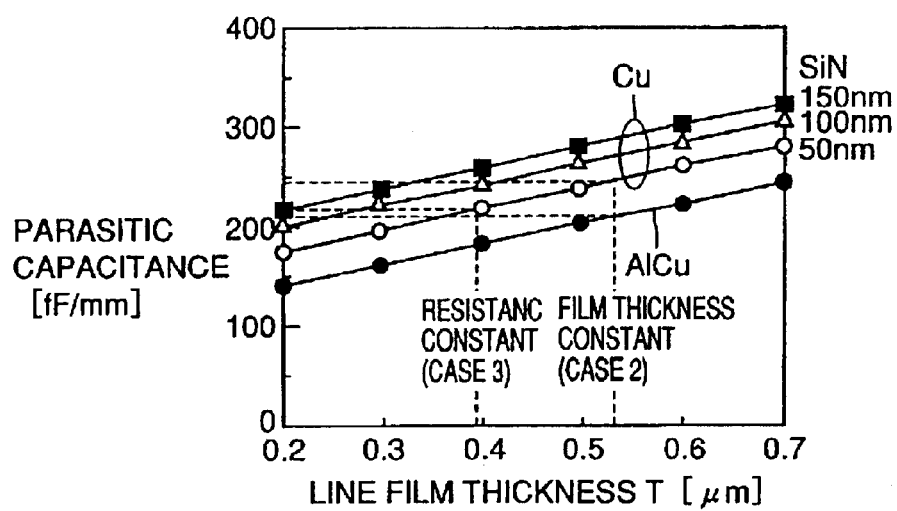
FIG. 18 is a graph showing relation between interconnection film thickness and parasitic capacitance.
Figure 19:
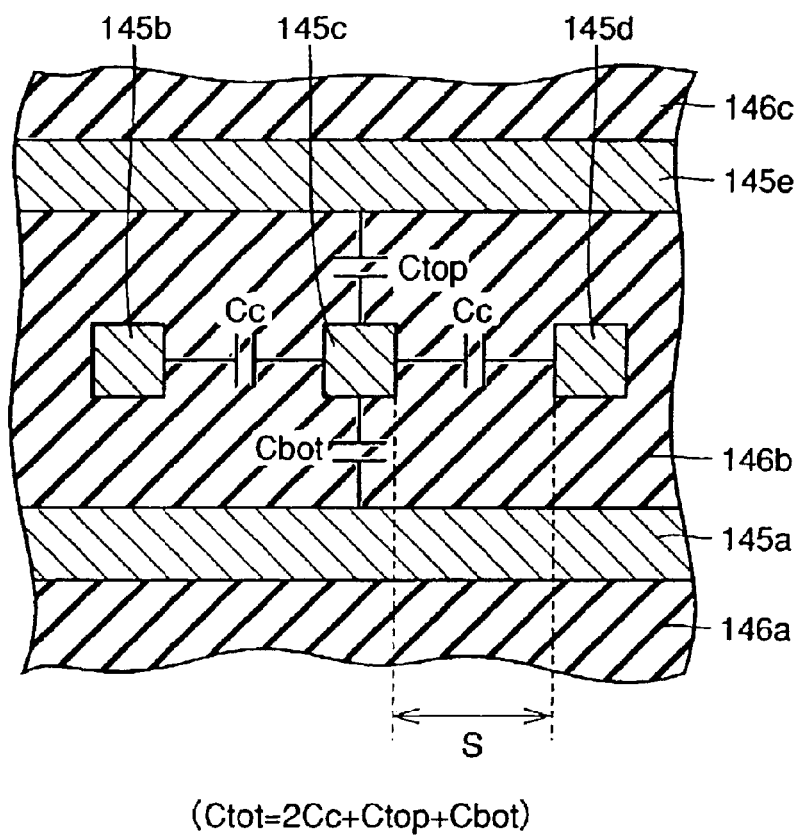
FIG. 19 is a schematic cross section representing a multi-layered interconnection structure of a semiconductor device related to the present invention.
Figure 20:
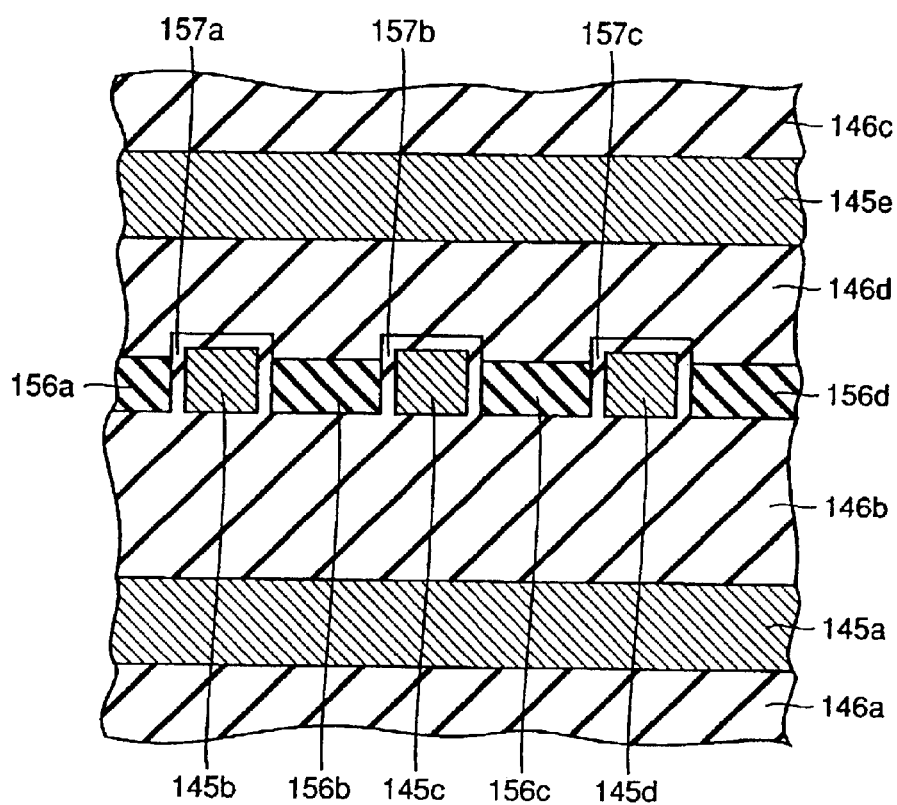
FIG. 20 is a schematic cross section showing another example of a multi-layered interconnection structure of a semiconductor device related to the present invention.

The basic conditions for the data of FIG. 18 are as follows. Line width W: 0.3 µm, line space S: 0.3 µm and specific dielectric constant of interlayer insulating film: 0.35.

Referring to FIG. 15, it is understood that when the interlayer film thickness T reduces, line resistance increases abruptly. One reason for this is that line resistance increases in proportion to reduction in cross sectional area of the interconnection. This is not the only cause, however, and there is the influence of barrier metals 51a to 51c (see FIGS. 16 and 17) having relatively high resistance than the materials of the interconnection. More specifically, barrier metals 51a to 51c represented by TiN, for example, serve to prevent diffusion of the interconnection material into the interlayer insulating film, and serve as an adhesion layer improving adhesiveness between materials. To ensure such functions, barrier metals 51a to 51c have lower limit thickness to which the thickness of the barrier metals can be reduced. Even when interconnection film thickness T is reduced, barrier metals 51a to 51c cannot have their film thicknesses made smaller than the lower limit. Therefore, the smaller the interconnection film thickness T, the larger the ratio of the thickness occupied by the barrier metal, which is a high resistance layer, with respect to the interconnection film thickness T. As a result, the smaller the interconnection film thickness T, the larger the line resistance becomes abruptly as a result, as shown in FIG. 15.

Conventionally, in the process of determining the thickness of barrier metals 51a to 51c, relation with the line resistance has not been considered.

Accordingly, referring to FIG. 17, the inventors determined the total film thickness x of barrier metal 51c in the direction of the line widths, to satisfy the relation of expression (12), where x represents total film thickness of barrier metal 51c in the direction of the line width, xmin represents minimum necessary film thickness of barrier metal 51c and K represents tolerable ratio of increase in resistance of the interconnection layer when line width W is reduced by ΔW.

More specifically, the minimum value of the line width is considered as line width W. When the data that minimum value of line width W is 0.3 µm, minimum necessary film thickness xmin of barrier metal 51c is 20 nm, ΔW is 0.015 µm (5% of the minimum value of line width W) and resistance has tolerable increase ratio of K of 1.1 are used, the total film thickness x of barrier metal 51c has to be within the range of 20 nm to 135 nm. At this time, the total film thickness of barrier metal 51c can be made to 100 nm (assuming that thickness x/2 of barrier metal 51c is 50 nm).

Similarly, film thickness y in the direction of film thickness T of barrier metal 51c is determined to satisfy the relation represented by the expression (13) where ymin represents the minimum necessary thickness of barrier metal 51c and K represents tolerable ratio of increase in line resistance when film thickness T of Cu is reduced by ΔT.

For example, when minimum necessary film thickness ymin is 20 nm, set film thickness T is 0.55 µm, ΔT is 0.0275 µm (5% of set film thickness T) and tolerable ratio of increase K is 1.1, thickness y of barrier metal 51c may be at least 20 nm and at most 247.5 nm. Therefore, the value of 50 nm may be used as the thickness y of barrier metal 51c.

$$\frac{x \min}{W} \leq \frac{x}{W} \leq 1 - \frac{K}{K-1} \times \frac{\Delta W}{W} \qquad (12)$$

$$\frac{y \min}{T} \leq \frac{y}{T} \leq 1 - \frac{K}{K-1} \times \frac{\Delta T}{T} \qquad (13)$$

In this manner, it is possible to ensure the function of the barrier metal and, even when the thickness and line width of interconnection layers may vary because of variation in manufacturing, the ratio of fluctuation of the line resistance of the interconnection layers can surely be kept in the range of the designed value. Therefore, degradation in electrical characteristics of the semiconductor device can be prevented.

The structure of barrier metal 51c shown in the third embodiment may be applied to the first embodiment of the present invention to provide similar effects.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of designing a semiconductor circuit for a semiconductor device including a first interconnection layer having relatively short line length, a first insulator formed to surround said first interconnection layer, a second interconnection layer having a longer line length than said first interconnection layer and a second insulator formed to surround said second interconnection layer, comprising the steps of:

preparing a first interconnection structure pattern including a plurality of interconnection layers having a prescribed distance between lines and containing a specific material, and an insulator formed to surround each of said plurality of interconnection layers and containing a specific material;

preparing a second interconnection structure pattern including a plurality of interconnection layers having a distance between lines approximately the same as said distance between lines of said plurality of interconnection layers of said first interconnection structure pattern and containing a specific material, and an insulator formed to surround each of said plurality of interconnection layers and containing a specific material;

calculating a first parasitic capacitance of each interconnection layer of said first interconnection structure pattern;

calculating a second parasitic capacitance of each interconnection layer of said second interconnection structure pattern;

selecting the material of said interconnection layer of said first or second interconnection structure pattern having smaller one of said first and second parasitic capacitances, as the material to be contained in said first interconnection layer; and selecting the material of said insulator of said first or second interconnection structure pattern having smaller one of said first and second parasitic capacitances, as the material to be contained in said first insulator.

2. The method of designing a semiconductor circuit according to claim 1, further comprising the steps of calculating a first line resistance of each interconnection layer of said first interconnection structure pattern;

calculating a second line resistance of each interconnection layer in said second interconnection structure pattern;

calculating a first evaluation value by multiplying said first parasitic capacitance and said first line resistance, in said first interconnection structure pattern;

calculating a second evaluation value by multiplying said first parasitic capacitance and said second line resistance, in said second interconnection structure pattern;

selecting the material of said interconnection layer of said first or second interconnection structure pattern having smaller one of said first and second evaluation values, as the material to be contained in said second interconnection layer; and selecting the material of said insulator of said first or second interconnection structure pattern having smaller one of said first and second evaluation values, as the material to be contained in said second insulator.

3. The method of designing a semiconductor circuit according to claim 1, wherein said distance between lines is approximately the same as minimum processing dimension in a photolithography step used in a process of manufacturing a semiconductor device.

4. A method of manufacturing a semiconductor device employing the method of designing a semiconductor circuit according to claim 1.

5. A method of designing a semiconductor circuit for a semiconductor device including a first interconnection layer having relatively short line length, a first insulator formed to surround said first interconnection layer, a second interconnection layer having longer line length than said first interconnection layer and a second insulator formed to surround said second interconnection layer, comprising the steps of:

preparing a first interconnection structure pattern including a plurality of interconnection layers having a prescribed distance between lines and containing aluminum, and an insulator formed to surround each of said plurality of interconnection layers and containing a specific material;

preparing a second interconnection structure pattern including a plurality of interconnection layers having a distance between lines approximately the same as said distance between lines of said plurality of interconnection layers of said first interconnection structure pattern and containing a specific material, and an insulator formed to surround each of said plurality of interconnection layers and containing a specific material;

preparing a third interconnection structure pattern including a plurality of interconnection layers having a distance between lines approximately the same as said distance between lines of said plurality of interconnection layers of said first interconnection structure pattern and containing copper and having a film thickness determined to attain approximately the same line resistance as said plurality of interconnection layers of said first interconnection structure pattern, and an insulator formed to surround each of said plurality of interconnection layers and containing a specific material;

calculating a first parasitic capacitance of each interconnection layer of said first interconnection structure pattern;

calculating a second parasitic capacitance of each interconnection layer of said second interconnection structure pattern;

calculating a third parasitic capacitance of each interconnection layer of said third interconnection structure pattern;

selecting the material of said interconnection layer of one of said first to third interconnection structure patterns having smaller one of said first to third parasitic capacitances, as the material to be contained in said first interconnection layer; and selecting the material of said insulator of one of said first to third interconnection structure patterns having smaller one of said first to third parasitic capacitances, as the material to be contained in said first insulator.

* * * * *